(12) United States Patent
Huang

(10) Patent No.: US 10,217,965 B2
(45) Date of Patent: Feb. 26, 2019

(54) ORGANIC LIGHT EMITTING DIODE DEVICE AND DISPLAY APPARATUS

(71) Applicant: WUHAN CHINA STAR OPTOELECTRONICS TECHNOLOGY CO., LTD., Wuhan, Hubei (CN)

(72) Inventor: Jing Huang, Hubei (CN)

(73) Assignee: WUHAN CHINA STAR OPTOELECTRONICS TECHNOLOGY CO., LTD., Wuhan, Hubei (CN)

(*) Notice: Subject to any disclaimer, the term of this patent is extended or adjusted under 35 U.S.C. 154(b) by 96 days.

(21) Appl. No.: 15/316,846

(22) PCT Filed: Jul. 12, 2016

(86) PCT No.: PCT/CN2016/089717
§ 371 (c)(1),
(2) Date: Dec. 7, 2016

(87) PCT Pub. No.: WO2017/215060
PCT Pub. Date: Dec. 21, 2017

(65) Prior Publication Data
US 2018/0212197 A1    Jul. 26, 2018

(30) Foreign Application Priority Data

Jun. 16, 2016 (CN) .......................... 2016 1 0429048

(51) Int. Cl.
*H01L 51/52* (2006.01)
*H01L 51/56* (2006.01)
*H01L 33/58* (2010.01)
*G02B 5/02* (2006.01)
*H01L 51/00* (2006.01)

(52) U.S. Cl.
CPC ........ *H01L 51/5268* (2013.01); *G02B 5/0242* (2013.01); *G02B 5/0247* (2013.01); *H01L 33/58* (2013.01); *H01L 51/5203* (2013.01); *H01L 51/56* (2013.01); *H01L 51/0096* (2013.01); *H01L 2251/5369* (2013.01); *H01L 2251/558* (2013.01)

(58) Field of Classification Search
CPC . H01L 51/5268; H01L 27/153; H01L 27/3211
See application file for complete search history.

(56) References Cited

U.S. PATENT DOCUMENTS

2012/0063145 A1   3/2012  Matsuzaki
2015/0171372 A1*  6/2015  Iwata ..................... C09D 5/22
                                                            257/40

FOREIGN PATENT DOCUMENTS

| CN | 102405424 A | 4/2012 |
|----|-------------|--------|
| CN | 103996797 A | 8/2014 |
| WO | 2008133285 A1 | 11/2008 |
| WO | 2014006987 A1 | 1/2014 |

* cited by examiner

*Primary Examiner* — Changhyun Yi
(74) *Attorney, Agent, or Firm* — Soroker Agmon Nordman

(57) ABSTRACT

An organic light emitting diode includes a glass substrate, a first electrode, an organic light emitting layer, a second electrode, and a light extracting enhanced layer below the glass substrate or on the second electrode. Material of the light extracting enhanced layer has a first material with a first index of refraction and a second material with a second index of refraction.

11 Claims, 1 Drawing Sheet

ORGANIC LIGHT EMITTING DIODE DEVICE AND DISPLAY APPARATUS

FIELD OF THE INVENTION

The present invention relates to a display technical field, and more particularly to an organic light emitting diode device and a display apparatus.

BACKGROUND OF THE INVENTION

Most photons of an organic light emitting diode (OLED) device limited between an organic light emitting layer and a glass substrate are induced due to gradients of index of refractions among an organic material, a substrate, and air, such that only from 20% to 30% of the photons can be emitted out of the device.

In order to improve a light extracting efficiency of a bottom of the OLED, a layer of a high index of refraction substrate is further introduced to transfer the photons outside the substrate. Nanometer/micrometer metal oxide particles with a high index of refraction, such as TiO2, ZrO2, and so on, are added as a scattering medium to change a direction of light propagation for emitting much more photons out of the device. However, a drawback of this method is that the index of refraction of the scattering medium is relatively high, and the difference between the substrate and the scattering particles is reduced. The scattering effect in the substrate is greatly reduced, and the light extracting efficiency is reduced.

As a result, it is necessary to provide an organic light emitting diode device and a display apparatus to solve the problems existing in the conventional technologies.

SUMMARY OF THE INVENTION

An object of the present invention is to provide an organic light emitting diode device and a display apparatus to solve a technical problem of a relatively poor light extracting efficiency induced by a poor scattering effect of the organic light emitting diode device existing in the conventional technologies.

To solve the above problems, an organic light emitting diode device of the present invention is constructed, which comprises:
 a glass substrate;
 a first electrode disposed on the glass substrate, wherein a material of the first electrode is a transparent material;
 an organic light emitting layer located on the first electrode;
 a second electrode disposed on the organic light emitting layer; and
 a light extracting enhanced layer located below the glass substrate, wherein a material of the light extracting enhanced layer comprises a first material with a first index of refraction and a second material with a second index of refraction, a difference value between the first index of refraction and the second index of refraction is greater than a preset threshold value, and a thickness of the light extracting enhanced layer is between 2 μm and 6 μm.

In the organic light emitting diode device of the present invention, the material of the light extracting enhanced layer comprises hollow polyimide balls and a polyimide matrix.

In the organic light emitting diode device of the present invention, the hollow polyimide balls are formed by a chemical imidization method.

In the organic light emitting diode device of the present invention, a ratio of the hollow polyimide balls with respect to the polyimide matrix is from 40% to 60%.

To solve the above problems, an organic light emitting diode device of the present invention is constructed, which comprises:
 a glass substrate;
 a first electrode disposed on the glass substrate;
 an organic light emitting layer located on the first electrode;
 a second electrode disposed on the organic light emitting layer; and
 a light extracting enhanced layer located on the second electrode, wherein a material of the light extracting enhanced layer comprises a first material with a first index of refraction and a second material with a second index of refraction, and a difference value between the first index of refraction and the second index of refraction is greater than a preset threshold value.

In the organic light emitting diode device of the present invention, the material of the light extracting enhanced layer comprises hollow polyimide balls and a polyimide matrix.

In the organic light emitting diode device of the present invention, the hollow polyimide balls are formed by a chemical imidization method.

In the organic light emitting diode device of the present invention, a ratio of the hollow polyimide balls with respect to the polyimide matrix is from 40% to 60%.

In the organic light emitting diode device of the present invention, a thickness of the light extracting enhanced layer is between 2 μm and 6 μm.

In the organic light emitting diode device of the present invention, a material of the first electrode is a non-transparent material.

The present invention further provides a display apparatus, comprising: a plurality of organic light emitting diode devices, each of the organic light emitting diode devices comprises:
 a glass substrate;
 a first electrode disposed on the glass substrate;
 an organic light emitting layer located on the first electrode;
 a second electrode disposed on the organic light emitting layer; and
 a light extracting enhanced layer below the glass substrate or on the second electrode, wherein a material of the light extracting enhanced layer comprises a first material with a first index of refraction and a second material with a second index of refraction, and a difference value between the first index of refraction and the second index of refraction is greater than a preset threshold value.

In the display apparatus of the present invention, the material of the light extracting enhanced layer comprises hollow polyimide balls and a polyimide matrix.

In the display apparatus of the present invention, the hollow polyimide balls are formed by a chemical imidization method.

In the display apparatus of the present invention, a ratio of the hollow polyimide balls with respect to the polyimide matrix is from 40% to 60%.

In the display apparatus of the present invention, a thickness of the light extracting enhanced layer is between 2 μm and 6 μm.

In the display apparatus of the present invention, the light extracting enhanced layer is located below the glass substrate when a material of the first electrode is a transparent material.

In the display apparatus of the present invention, the light extracting enhanced layer is located on the second electrode when a material of the first electrode is a non-transparent material.

In the organic light emitting diode device and the display apparatus of the present invention, a relatively high contrast of index of refraction is formed by adding a light extracting enhanced layer formed by a material with a relatively high index of refraction and a material with a relatively low index of refraction onto the outermost layer of the conventional organic light emitting diode device, thereby improving the scattering effect and the light extracting efficiency.

DETAILED DESCRIPTION OF THE PREFERRED EMBODIMENTS

The following description of the embodiments with reference to the appended drawings is used for illustrating specific embodiments which may be used for carrying out the present invention. The directional terms described by the present invention, such as "upper", "lower", "front", "back", "left", "right", "inner", "outer", "side", etc., are only directions by referring to the accompanying drawings. Thus, the used directional terms are used to describe and understand the present invention, but the present invention is not limited thereto. In figures, elements with similar structures are indicated as the same numbers.

Figure 1:
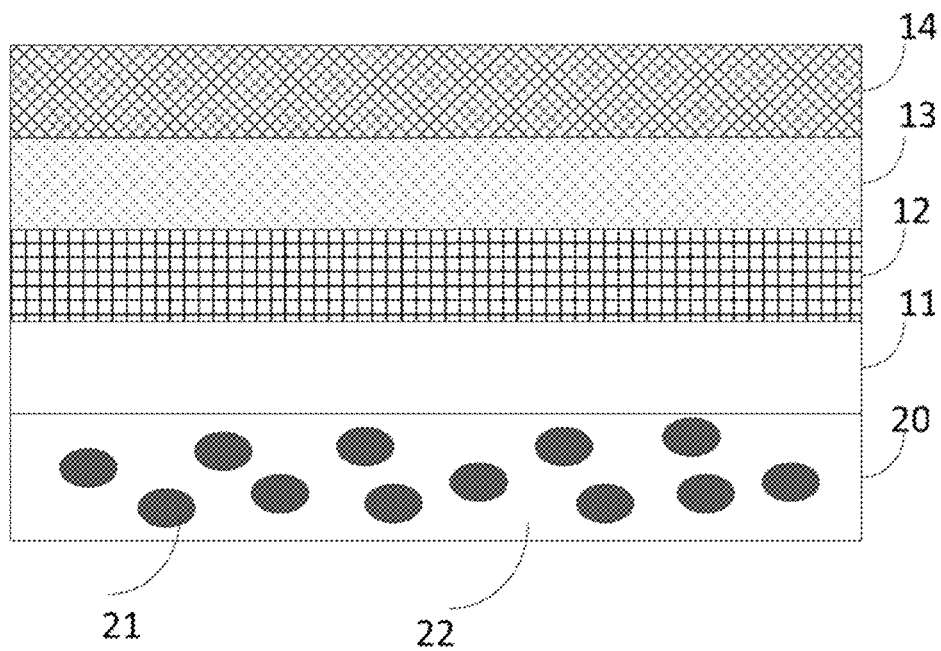
FIG. 1 is a structural schematic diagram of a first kind of an organic light emitting diode device of the present invention.

Please referring to FIG. 1, FIG. 1 is a structural schematic diagram of a first kind of an organic light emitting diode device of the present invention.

As shown in FIG. 1, an organic light emitting diode device of the present invention comprises: a glass substrate 11, a first electrode 12, an organic light emitting layer 13, a second electrode 14 and a light extracting enhanced layer 20. The first electrode 12 is disposed on the glass substrate 11. The organic light emitting layer 13 is located on the first electrode 12. The second electrode 14 is disposed on the organic light emitting layer 13. Of course, a thin film packing layer can be further disposed on the second electrode 14, wherein a material of the light extracting enhanced layer 20 comprises a first material with a first index of refraction and a second material with a second index of refraction, and a difference value between the first index of refraction and the second index of refraction is greater than a preset threshold value, i.e., a difference between the first index of refraction and the second index of refraction is relatively high. The preset threshold value can be set based on experience, i.e., the light extracting enhanced layer is formed by a material with a relatively high gradient of index of refraction.

Preferably, a material of the first electrode 12 can be a transparent material, such as indium tin oxide. A material of the second electrode 14 is a non-transparent material.

Preferably, the material of the light extracting enhanced layer 20 comprises hollow polyimide balls 21 and a polyimide matrix 22. Due to the index of refraction of the hollow polyimide balls being relatively low and the index of refraction of the polyimide matrix being relatively high, a relatively high gradient of index of refraction can be formed to improve the scattering effect and increase the light extracting efficiency.

Preferably, the hollow polyimide balls 21 are formed by a chemical imidization method. Since particles in the conventional nanometer or micrometer scattering layer are easily adhesive therebetween, the uniformity of particles is poor. Therefore, the hollow polyimide balls with excellent monodisperse can be obtained by the chemical imidization method, such that the hollow polyimide balls are not adhesive therebetween. The uniformity of particles is improved, and the light extracting efficiency is further increased.

Preferably, a ratio of the hollow polyimide balls 21 with respect to the polyimide matrix 22 is from 40% to 60%, more preferably from 45% to 50%. The scattering effect is poor due to having too small a ratio. If the ratio is too large, a material is wasted much more and causes a relatively high cost.

Preferably, a thickness of the light extracting enhanced layer 20 is between 2 μm and 6 μm, more preferably between 3 μm and 5 μm. The contrast of index of refraction is relatively poor due to having too small a thickness. Too large a thickness will increase an entire thickness of the organic light emitting diode device. Further, the thickness of the display apparatus is increased.

Figure 2:
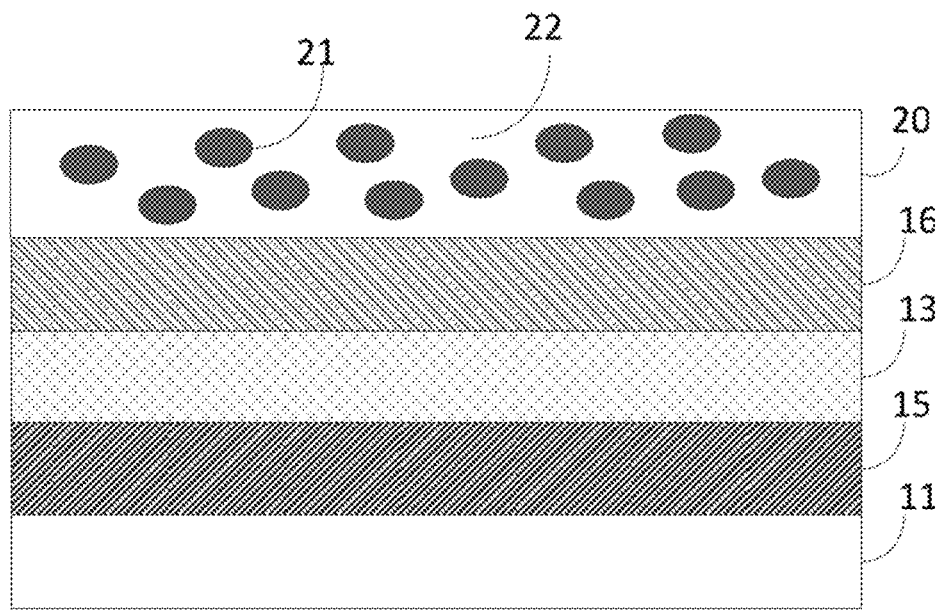
FIG. 2 is a structural schematic diagram of a second kind of an organic light emitting diode device of the present invention.

Please refer to FIG. 2. FIG. 2 is a structural schematic diagram of a second kind of an organic light emitting diode device of the present invention.

As shown in FIG. 2, an organic light emitting diode device of the present invention comprises: a glass substrate 11, a first electrode 15, an organic light emitting layer 13, a second electrode 16, and a light extracting enhanced layer 20. The first electrode 15 is disposed on the glass substrate 11. The organic light emitting layer 13 is located on the first electrode 15. The second electrode 16 is disposed on the organic light emitting layer 13, wherein the light extracting enhanced layer 20 is located on the second electrode 16. Of course, a thin film packing layer can be further disposed on the second electrode 16, and the light extracting enhanced layer 20 is located on the thin film packing layer. A material of the light extracting enhanced layer 20 comprises a first material with a first index of refraction and a second material with a second index of refraction, and a difference value between the first index of refraction and the second index of refraction is greater than a preset threshold value, i.e., a difference between the first index of refraction and the second index of refraction is relatively high. The preset threshold value can be set based on experience, i.e., the light extracting enhanced layer is formed by a material with a relatively high gradient of index of refraction.

Preferably, a material of the first electrode 15 is a non-transparent material, such as metal. A material of the second electrode 16 is a magnesium aluminum alloy, i.e., photons can pass through the second electrode 16.

Preferably, the material of the light extracting enhanced layer 20 comprises hollow polyimide balls 21 and a polyimide matrix 22. Due to the index of refraction of the hollow polyimide balls being relatively low and the index of refraction of the polyimide matrix being relatively high, a relatively high gradient of index of refraction can be formed to improve the scattering effect and increase the light extracting efficiency.

Preferably, the hollow polyimide balls 21 are formed by a chemical imidization method. Since particles in the conventional nanometer or micrometer scattering layer are easily adhesive therebetween, the uniformity of particles is poor. Therefore, the hollow polyimide balls with excellent monodisperse can be obtained by the chemical imidization method, such that the hollow polyimide balls are not adhesive therebetween. The uniformity of particles is improved, and the light extracting efficiency is further increased.

Preferably, a ratio of the hollow polyimide balls 21 with respect to the polyimide matrix 22 is from 40% to 60%, more preferably from 45% to 50%. The scattering effect is poor due to too small a ratio. If the ratio is too large, a material is wasted much more and causes a relatively high cost.

Preferably, a thickness of the light extracting enhanced layer 20 is between 2 μm and 6 μm, more preferably between 3 μm and 5 μm. The contrast of index of refraction is relatively poor due to too small a thickness. Too large a thickness will increase an entire thickness of the organic light emitting diode device. Further, the thickness of the display apparatus is increased.

Specifically, the above hollow polyimide balls are formed by the following methods:

First, two monomers used to synthesize high index of refraction polyimide matrix PI (n>1.8), dianhydride monomers and diamine monomers are dissolved in a ratio of 1:1 into a solvent (such as dimethylacetamide DMAc), the two kinds of monomers produce a polymerizing reaction to generate PI precursors, i.e., polyamic acid PAA.

Then, polystyrene template sulfonated balls are dispersed in the solvent DMAc, and the linear polystyrene template sulfonated balls are removed by centrifugation. The remaining polystyrene template sulfonated balls are dispersed in the solvent, and the solvent is dropped into a solvent containing PAA at a certain rate. After stirring a period of time, the unnecessary and unadsorbed PAA is removed by centrifugation, and the PAA hollow composite balls are washed many times by a solvent.

Then, an imidization is performed on the PAA hollow composite balls by using a chemical imidization method. A certain amount of acetic anhydride and pyridine are dropped into the dispersed liquid of the PAA hollow composite balls. After stirring a period of time at room temperature, a mixing liquid of water and ethanol. The precipitated powder are washed by water and ethanol in many times, and then the precipitated powder is heated and crosslinks under a nitrogen atmosphere to obtain the PI's hollow composite balls.

In the specific fabricating process of the above light extracting enhanced layer, the dispersed liquid of the PI's hollow composite bails is coated below the glass substrate or on the thin film packing layer in FIG. 1 or FIG. 2. Since the hollow polyimide balls are formed by using the chemical imidization method, an effect of "isolating" each other is achieved by the hollow polyimide balls in the dispersed liquid accordingly. Then, after a heat treatment, the balls therebetween are not easily to cause an adhesive phenomenon again. Then, the high index of refraction polyimide matrix is used as a substrate or a backfill layer material is coated to the outermost layer, and a relatively high difference of index of refraction, with respect to a low index of refraction center formed by the hollow balls, is formed.

In the organic light emitting diode device of the present invention, a relatively high contrast of index of refraction is formed by adding a light extracting enhanced layer formed by a material with a relatively high index of refraction and a material with a relatively low index of refraction below the glass substrate or on the second electrode, thereby improving the scattering effect and the light extracting efficiency.

The present invention further provides a display apparatus which comprises a plurality of organic light emitting diode devices, as shown in FIG. 1 or FIG. 2. Each of the organic light emitting diode devices comprises: a glass substrate 11, a first electrode 12 or 15, an organic light emitting layer 13, a second electrode 14 or 16 and a light extracting enhanced layer 20. The first electrode 12 or 15 is disposed on the glass substrate 11. The organic light emitting layer 13 is located on the first electrode 12 or 15. The second electrode 14 or 16 is disposed on the organic light emitting layer 13, wherein the light extracting enhanced layer 20 is located below the glass substrate 11 or on the second electrode 14 or 16. Of course, a thin film packing layer can be further disposed on the second electrode 14 or 16, and the light extracting enhanced layer 20 is located on the thin film packing layer. A material of the light extracting enhanced layer 20 comprises a first material with a first index of refraction and a second material with a second index of refraction, and a difference value between the first index of refraction and the second index of refraction is greater than a preset threshold value, i.e., a difference between the first index of refraction and the second index of refraction is relatively high. The preset threshold value can be set based on experience, i.e., the light extracting enhanced layer is formed by a material with a relatively high gradient of index of refraction.

Preferably, a material of the first electrode 12 can be a transparent material, such as indium tin oxide. A material of the second electrode 14 is a non-transparent material. The light extracting enhanced layer 20 is located below the glass substrate 11.

Preferably, a material of the first electrode 15 is a non-transparent material, such as metal. The light extracting enhanced layer 20 is located on the second electrode 16. A material of the second electrode 16 is a magnesium aluminum alloy, i.e., photons can pass through the second electrode 16.

Preferably, the material of the light extracting enhanced layer 20 comprises hollow polyimide balls 21 and a polyimide matrix 22. Due to the index of refraction of the hollow polyimide balls being relatively low and the index of refraction of the polyimide matrix being relatively high, a relatively high gradient of index of refraction can be formed to improve the scattering effect and increase the light extracting efficiency.

Preferably, the hollow polyimide balls 21 are formed by a chemical imidization method. Since particles in the conventional nanometer or micrometer scattering layer are easily adhesive therebetween, the uniformity of particles is poor. Therefore, the hollow polyimide balls with excellent monodisperse can be obtained by the chemical imidization method, such that the hollow polyimide balls are not adhesive therebetween. The uniformity of particles is improved, and the light extracting efficiency is further increased.

Preferably, a ratio of the hollow polyimide balls 21 with respect to the polyimide matrix 22 is from 40% to 60%, more preferably from 45% to 50%. The scattering effect is poor due to too small a ratio. If the ratio is too large, a material is wasted much more and causes a relatively high cost.

Preferably, a thickness of the light extracting enhanced layer 20 is between 2 μm and 6 μm, more preferably between 3 μm and 5 μm. The contrast of index of refraction is relatively poor due to too small a thickness. Too large a thickness will increase an entire thickness of the organic light emitting diode device. Further, the thickness of the display apparatus is increased.

In the display apparatus of the present invention, a relatively high contrast of index of refraction is formed by adding a light extracting enhanced layer formed by a material with a relatively high index of refraction and a material with a relatively low index of refraction below the glass substrate or on the second electrode, thereby improving the scattering effect and the light extracting efficiency.

As described above, although the present invention has been described in preferred embodiments, they are not intended to limit the invention. One of ordinary skill in the art, without departing from the spirit and scope of the invention within, can make various modifications and variations, so the range of the scope of the invention is defined by the claims.

What is claimed is:

1. A method of fabricating an organic light emitting diode device, comprising:
    providing a glass substrate;
    forming a first electrode on the glass substrate, wherein a material of the first electrode is a transparent material;
    forming an organic light emitting layer on the first electrode;
    forming a second electrode on the organic light emitting layer; and
    forming a light extracting enhanced layer below the glass substrate,
    wherein a material of the light extracting enhanced layer comprises hollow polyimide balls with a first index of refraction and a polyimide matrix with a second index of refraction,
    wherein forming the light extracting enhanced layer below the glass substrate comprises:
        forming the hollow polyimide balls using a chemical imidization method;
        adding the hollow polyimide balls into a dispersing liquid; and
        coating the hollow polyimide balls with the dispersing liquid below the glass substrate, wherein the polyimide matrix is below the glass substrate; and
    wherein the first index of refraction is less than the second index of refraction, and a thickness of the light extracting enhanced layer is between 2 μm and 6 μm.

2. The method of fabricating the organic light emitting diode device according to claim 1, wherein a ratio of the hollow polyimide balls with respect to the polyimide matrix is from 40% to 60%.

3. A method of fabricating an organic light emitting diode device, comprising:
    providing a glass substrate;
    forming a first electrode on the glass substrate;
    forming an organic light emitting layer on the first electrode;
    forming a second electrode on the organic light emitting layer; and
    forming a light extracting enhanced layer on the second electrode, wherein a material of the light extracting enhanced layer comprises hollow polyimide balls with a first index of refraction and a polyimide matrix with a second index of refraction,
    wherein forming the light extracting enhanced layer on the second electrode comprises:
        forming the hollow polyimide balls using a chemical imidization method:
        adding the hollow polyimide balls into a dispersing liquid; and
        coating the hollow polyimide balls with the dispersing liquid on the second electrode, wherein the polyimide matrix is below the glass substrate; and
    wherein the first index of refraction is less than the second index of refraction.

4. The method of fabricating the organic light emitting diode device according to claim 3, wherein a ratio of the hollow polyimide balls with respect to the polyimide matrix is from 40% to 60%.

5. The method of fabricating the organic light emitting diode device according to claim 3, wherein a thickness of the light extracting enhanced layer is between 2 μm and 6 μm.

6. The method of fabricating the organic light emitting diode device according to claim 3, wherein a material of the first electrode is a non-transparent material.

7. A method of fabricating a display apparatus, comprising:
    forming a plurality of organic light emitting diode devices, wherein forming each of the organic light emitting diode devices comprises:
    providing a glass substrate;
    forming a first electrode on the glass substrate;
    forming an organic light emitting layer on the first electrode;
    forming a second electrode on the organic light emitting layer; and
    forming a light extracting enhanced layer below the glass substrate or on the second electrode, wherein a material of the light extracting enhanced layer comprises hollow polyimide balls with a first index of refraction and a polyimide matrix with a second index of refraction,
    wherein forming the light extracting enhanced layer below the glass substrate or on the second electrode comprises:
        forming the hollow polyimide balls using a chemical imidization method
        adding the hollow polyimide balls into a dispersing liquid; and
        coating the hollow polyimide balls with the dispersing liquid below the glass substrate or on the second electrode, wherein the polyimide matrix is below the glass substrate or on the second electrode; and
    wherein the first index of refraction is less than the second index of refraction.

8. The method of fabricating the display apparatus according to claim 7, wherein a ratio of the hollow polyimide balls with respect to the polyimide matrix is from 40% to 60%.

9. The method of fabricating the display apparatus according to claim 7, wherein a thickness of the light extracting enhanced layer is between 2 μm and 6 μm.

10. The method of fabricating the display apparatus according to claim 7, wherein the light extracting enhanced layer is located below the glass substrate when a material of the first electrode is a transparent material.

11. The method of fabricating the display apparatus according to claim 7, wherein the light extracting enhanced layer is located on the second electrode when a material of the first electrode is a non-transparent material.

* * * * *